(12) United States Patent
Jantke et al.

(10) Patent No.: US 6,177,285 B1
(45) Date of Patent: Jan. 23, 2001

(54) PROCESS FOR DETERMINING THE CRYSTAL ORIENTATION IN A WAFER

(75) Inventors: Gabriele Jantke; Arno Steckenborn, both of Berlin; Thoralf Winkler, Gauernitz, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/142,124

(22) PCT Filed: Feb. 28, 1997

(86) PCT No.: PCT/DE97/00440

§ 371 Date: Feb. 5, 1999

§ 102(e) Date: Feb. 5, 1999

(87) PCT Pub. No.: WO97/32341

PCT Pub. Date: Sep. 4, 1997

(30) Foreign Application Priority Data

Mar. 1, 1996 (DE) .............................................. 196 09 399

(51) Int. Cl.$^7$ ............................. G01R 31/26; H01L 21/66
(52) U.S. Cl. ............................ 438/14; 438/401; 438/973; 438/733; 216/2; 216/39
(58) Field of Search ............................... 156/643; 216/99, 216/51, 39; 438/14, 748, 401, 462, 71, 924, 942, 973, 733; 117/63, 101, 902, 923

(56) References Cited

U.S. PATENT DOCUMENTS

| | | | |
|---|---|---|---|
| 4,098,917 | * | 7/1978 | Bullock et al. .................... 216/51 |
| 4,405,238 | * | 9/1983 | Grobman et al. .................. 356/401 |
| 4,470,875 | * | 9/1984 | Poteat ................................. 438/70 |
| 4,542,397 | * | 9/1985 | Biegelsen et al. ................. 257/72 |
| 4,863,560 | * | 9/1989 | Hawkins ............................. 216/27 |
| 5,282,926 | * | 2/1994 | Trah et al. .......................... 216/27 |
| 5,441,600 | * | 8/1995 | Smits .................................. 216/51 |
| 5,484,507 | * | 1/1996 | Ames ..................................... 216/2 |
| 5,639,387 | * | 6/1997 | Shahid ................................ 216/39 |
| 5,883,012 | * | 3/1999 | Chiou et al. ...................... 438/748 |
| 5,913,134 | * | 6/1999 | Drayton et al. .................. 438/456 |

FOREIGN PATENT DOCUMENTS

| | | |
|---|---|---|
| 41 36 089 | 5/1993 | (DE) . |
| 41 34 291 | 7/1993 | (DE) . |
| 43 34 666 | 12/1994 | (DE) . |
| 022 30 751 | 9/1990 | (JP) . |

OTHER PUBLICATIONS

Dino R. Ciarlo, "A latching accelerometer fabricated by the anisotropic etching of (110) oriented silicon wafers," J. Micromech. Microeing. 2 (1992) 10–13.

* cited by examiner

Primary Examiner—Olik Chaudhuri
Assistant Examiner—William David Coleman
(74) Attorney, Agent, or Firm—Kenyon & Kenyon

(57) ABSTRACT

A method for determining the crystal orientation of a wafer using anisotropic etching in which an etching mask having mask openings such as circle scale marks arranged one beside the other is applied in relation to a preexisting marking of the wafer. Mask openings are configured in a double-T shape and are arranged one beside the other so that their first, transversely extending segments and the second transversely extending segments are situated at a predetermined distance apart and the areas connecting the segments are situated equidistant. The crystal orientation is determined with the distance of the two particular adjacent mask openings, the intervening space of which is least undercut, from the preexisting marking.

6 Claims, 3 Drawing Sheets

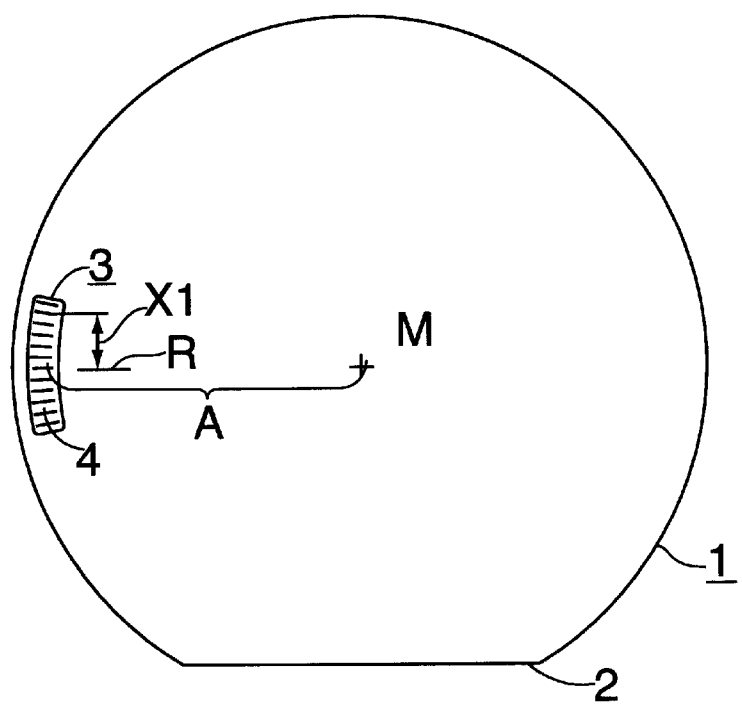
FIG. 1
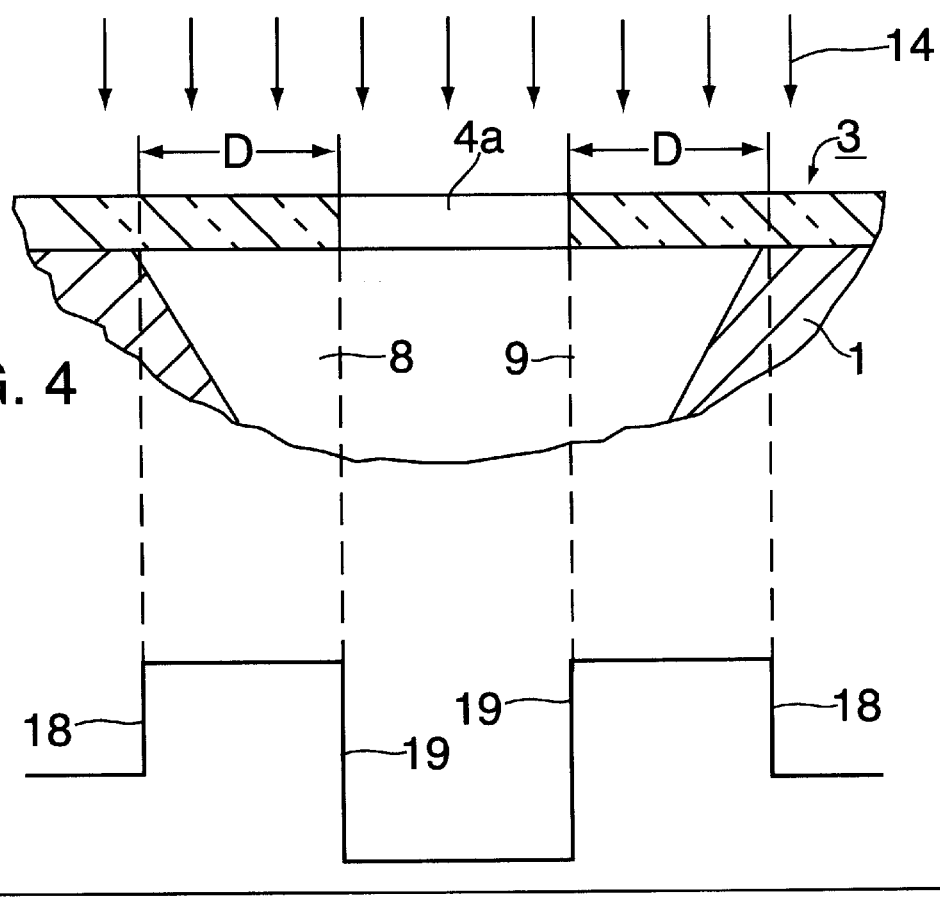
FIG. 4
FIG. 5

PROCESS FOR DETERMINING THE CRYSTAL ORIENTATION IN A WAFER

FIELD OF THE INVENTION

The present invention relates to a method of determining crystal orientation in a wafer made from a crystal with a zinc-blende crystal structure in which an etching mask having mask openings such as circular scale marks arranged one beside the other is applied in relation to a predefined marking of the wafer, and the wafer is etched anisotropically, producing etched-out channels, and the crystal orientation can be inferred from the etching structure of the channels. For example, silicon or germanium or gallium arsenide has a zinc-blende crystal structure.

BACKGROUND INFORMATION

A method of determining crystal orientation in a wafer is described in the publication "A latching accelerometer fabricated by the anisotropic etching of (110)-oriented silicon wafers" by Dino R. Ciarlo in the journal "Micromech. Microeng.," 2, 1992, pages 10–13. According to the method described therein, rectangular mask openings such as circular scale marks are arranged one next to the other. The angle between two adjacent rectangular mask openings is 0.1°. Each rectangular mask opening is 8 μm wide and 3 mm long. During anisotropic etching of the wafer surface to which the etching mask has been applied, undercut zones, which are bounded by (111) planes, develop at the sides of the mask openings. The dimensions of the undercut zone will vary depending on the orientation of the mask opening relative to the crystal orientation which is to be found. The dimensions of a particular undercut zone are determined optically, and the location of the mask opening at the side of which the undercut zone is smallest is utilized for determining the crystal orientation. The dimension of the smallest undercut zone must be larger than the wavelength of the light used for measuring in order for it to be perceived; thus it must be larger than around 0.5 μm. This is ensured according to this method, among other things, by the dimensions selected for the rectangular mask openings. The achievable angle precision in determining crystal orientation using this method depends on the angle between two adjacent mask openings. For reasons related to the manufacture of masks, this angle cannot be made smaller than 0.1°. The best precision achievable in determining crystal orientation is thus 0.05°. The required etching time in the known method is around 30 hours, depending on the length of the rectangular mask openings. While a reduction of the length of the rectangular mask openings would result in a reduction in etching time, it would also affect the dimensions of the undercut zones causing them no longer to be measurable.

SUMMARY OF THE INVENTION

An object of the present invention is to provide a method for determining crystal orientation in a wafer by which at least the same precision in determining crystal orientation can be realized as that of the conventional method in a comparably smaller amount of time.

This object is achieved in a method according to the present invention through the mask openings each containing two relatively short segments which in their longitudinal direction are almost parallel, with the first segment always being somewhat shorter than the second segment and each having a relatively long area which extends between each first and second segments forming a mask opening in the shape of a double T. The mask openings are arranged one beside the other each generating a modified double-T shaped mask opening, so that with equally large intervening distances between the areas, the first segments and the second segments are a predetermined distance from each other. The crystal orientation is determined with the distance of the two particular adjacent mask openings, whose intervening space is least undercut, from the preexisting marking.

An advantage of the method according to the present invention is that the length of the double-T mask openings can be selected to be smaller than the length of the rectangular mask openings in the known method by at least one order of magnitude and thus the required etching time is reduced accordingly. At the same time, the use of the double-T mask openings causes the dimensions of the undercut zones to remain easily measurable by optical means. The precision in the determination of crystal orientation is at least as good as with the conventional method.

In an advantageous embodiment of the method according to the present invention, the wafer is etched until at least one intervening space remains; the position of this intervening space is determined as the distance from the preexisting marking. An advantage of this procedure is that only a relatively small degree of measurement effort is required for determining the position of the intervening space. For example, it is possible to determine the position of this intervening space with the naked eye.

An additional advantageous embodiment of the method according to the present invention is achieved through the wafer being etched until an etched face, forming from the first segment or from the second segment of the mask openings along the area, extends over more than half of the length of the area and the sizes of all intervening spaces between each two etched-out channels being utilized for determining the crystal orientation.

An advantage of this further embodiment of the method according to the present invention is that on the basis of a plurality of determined sizes of intervening spaces, crystal orientation can be determined with a relatively high degree of precision.

An additional advantageous embodiment of the method according to the present invention is achieved through obtaining a series of intensity values from the optical measurement of intensities reflected from the wafer along a straight orientation line running parallel to the segments and intersecting the area approximately at its middle.

The series of intensity values is used in calculating the remaining sizes of the intervening spaces which are not undercut between each two adjacent etched-out channels in the direction of the orientation line. An inference on the crystal orientation is made on the basis of the distance between the channels associated with the largest determined intervening space sizes from the preexisting marking.

An advantage of this additional embodiment of the method according to the present invention is that the precise determination of crystal orientation can be performed automatically, i.e., it can be utilized in an automatic production unit.

In a further embodiment of the method according to the present invention, in a circular wafer a radius line parallel to a flat of the wafer is selected as the preexisting marking, and the crystal orientation is determined through determining the angle which in relation to the center of the circular wafer is formed by the distance of the mask openings with the least undercut intervening space from the radius line.

An advantage of this further embodiment of the method according to the present invention is that the wafer can be easily positioned in the direction of the crystal orientation after determination of the angle through appropriate rotation.

BRIEF DESCRIPTION OF THE DRAWINGS

FIG. 1 illustrates a wafer with a mask for carrying out the method according to the present invention.

FIG. 4 illustrates a cross section through an etched zinc-blend crystal structure at the location of a mask opening.

FIG. 5 illustrates a curve of reflected intensities at the location of the same mask opening.

DETAILED DESCRIPTION

In FIG. 1, a circular wafer 1 is depicted which has a preexisting marking 2 in the form of a flat. Marking 2 was applied by the manufacturer of wafer 1 for crystal orientation with a precision of ±0.5°. In many cases of further processing of a wafer, this degree of precision is not adequate, for which reason, by way of example, a better alignment of the wafer with respect to its crystal orientation is necessary prior to application of masks for etching.

If, for example, the surface of wafer 1 is in the (100) plane, it may be necessary to determine the (110) direction as precisely as possible. For this purpose, a circular etching mask 3 is applied to wafer 1, only a few mask openings 4 of which mask are represented schematically in FIG. 1 by short lines. Mask 3 is applied at a mean distance A from midpoint M of the circular wafer 1. In addition, a portion R of a radius line is marked on wafer 1 which is aligned parallel to preexisting marking 2.

Figure 2:
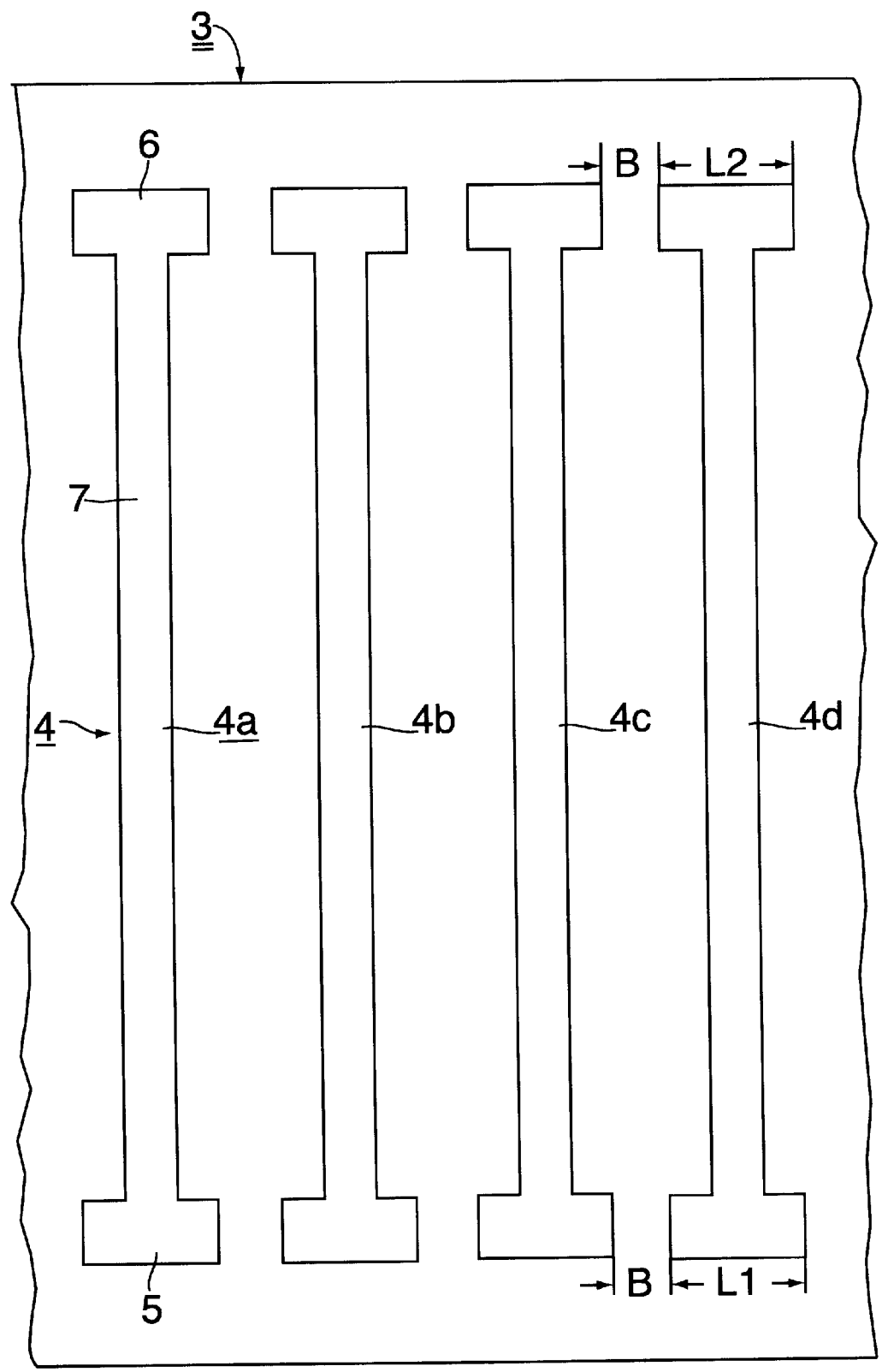
FIG. 2 illustrates an area of the wafer covered by the mask in further detail.

As can be seen in detail in FIG. 2, the mask section depicted has double-T mask openings 4a, 4b, 4c, and 4d, each of which is composed of a first segment 5 and a second segment 6, first segment 5 with a length L1 being somewhat shorter than second segment 6 with a length L2; between segments 5 and 6 of each of mask openings 4a through 4d, there is an area 7. The double-T-shaped mask openings 4a through 4d are arranged side by side so that the first segments 5 and the second segments 6 are in each case a predetermined distance B apart and all in their lengthwise direction are situated approximately in the (110) direction. The areas 7 of the mask openings are arranged equidistant from each other.

Figure 3:
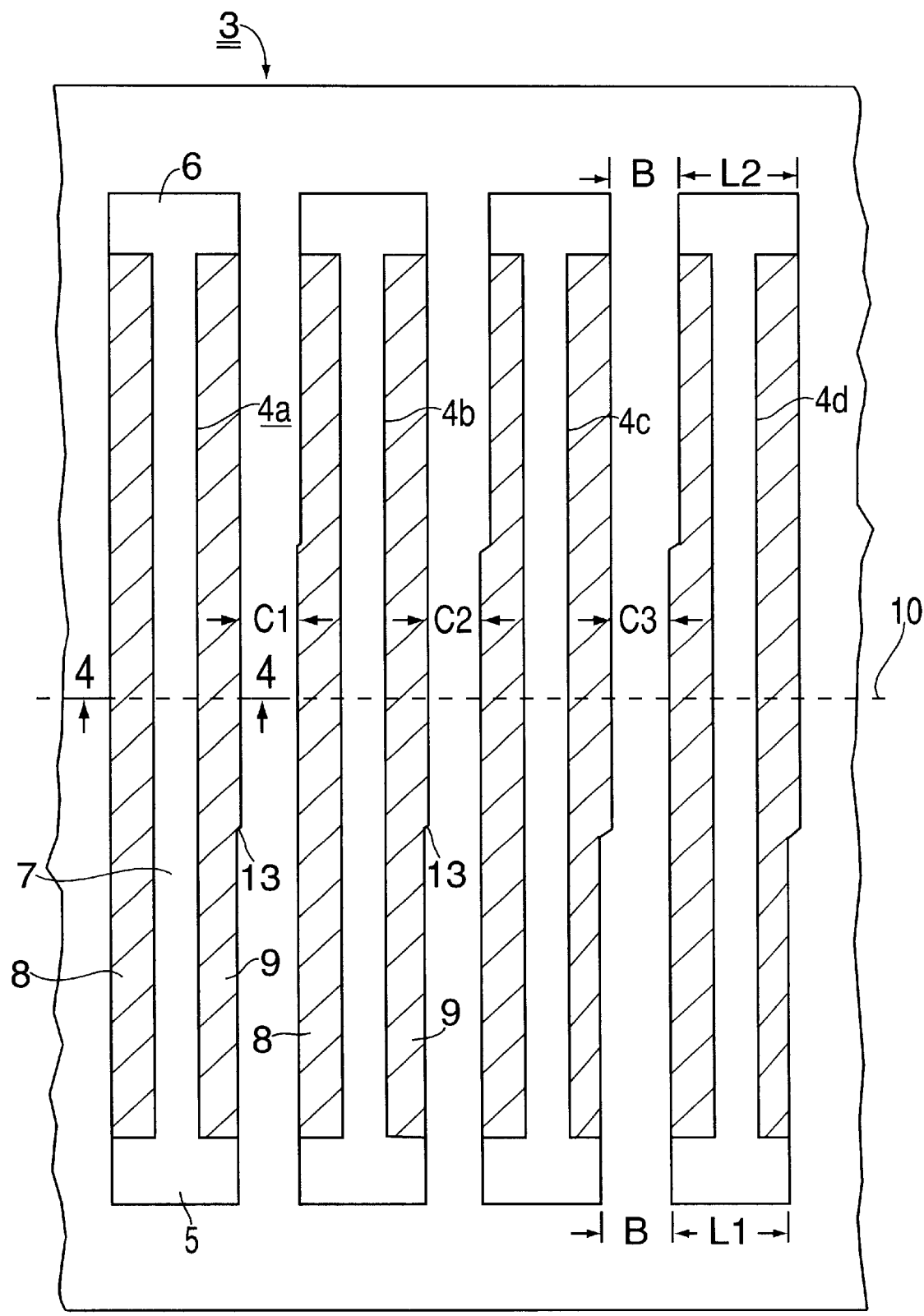
FIG. 3 illustrates etching results for the further detail upon application of the method according to the present invention.

After application of etching mask 3, anisotropic etching takes place. In this process, undercut zones 8 and 9 (diagonally hatched) extending below etching mask 3 between each two segments 5 and 6 of a mask opening are formed, as can be seen in FIG. 3. Depending on the anisotropic etching properties of the zinc-blende crystal structure, zones 8 and 9 are bounded by (111) planes which intersect the wafer surface in the (110) direction. Along a straight line 10, width dimensions C1, C2, and C3 of non-undercut intervening spaces which form between the outer edges of undercut zones 8 and 9 of adjacent mask openings 4a, 4b and 4b, 4c, and 4c, 4d become increasingly smaller the further the particular mask opening is from the mask opening which lies precisely in the (110) direction. In other words, the position of mask opening 4a next to which the width C1 of the non-undercut intervening space is the largest can be utilized for determining the crystal orientation.

In the exemplary embodiment depicted, the (111) planes have a limiting effect on the etching process because in comparison to the (110) and (100) planes, they are etched away at a rate which has a ratio of only approximately 600:300:1 for planes (110):(100):(111). This means that the etching process can be continued until the width dimensions C2 and C3 become zero and only one width dimension C1 remains. The position of the intervening space associated with the remaining width dimension C1 is then utilized for determining the crystal orientation.

On the other hand, the etching process can also be interrupted after etched faces 13 forming along the area 7 have extended beyond straight line 10. The dimensions of the undercut zones 8 and 9 can, by way of example, be determined along line 10 by exposing etching mask 3 to light and obtaining intensity values of reflected light along line 10 for forming a light intensity curve.

In particular one possible procedure is—as shown in FIG. 4 in which the area around mask opening 4a is depicted greatly enlarged—for a parallel bundle, by way of example, of white light 14 to be radiated onto etching mask 4. Mask opening 4a reflects the incident light the least while the portion of etching mask 3 projecting beyond the undercut zones reflects the lights most intensively. Dimension D of undercut zones 8 and 9 is interesting because width dimensions C1, C2, and C3 of non-undercut intervening spaces can be calculated from the measured dimensions D of undercut zones 8 and 9.

From edges 18 and 19 of the light intensity curve depicted in FIG. 5 across width X of mask 3, dimension D can be determined by measurement techniques.

When the two mask openings (for example 4a and 4b according to FIG. 3), between which the intervening space is least undercut are determined, through determination of the width measurements of the undercut intervening spaces between mask openings 4a through 4d, its distance X1 from the portion R of the radius line is determined. From this determined distance X1 and the distance A of etching mask 3 from midpoint M, the angle can be determined, using the tangent function, by which wafer 1 must be rotated starting with flat 2 to be able to position an etching mask to be applied for processing of the wafer precisely in alignment with the crystal orientation.

Using double-T-shaped mask openings 4a through 4d with a total length of around 200 μm, a precision of at least 0.01° can be achieved in determining crystal orientation with the etching time being less than 2 hours.

What is claimed is:

1. A method of determining crystal orientation in a wafer, the wafer being made of crystal with a zinc-blend crystal structure, comprising the steps of:

applying an etching mask on the wafer in a determined position relative to a preexisting marking of the wafer, the etching mask having mask openings arranged next to each other, each of the mask openings including two segments, the two segments aligned parallel to each other in a longitudinal direction, a first segment of the two segments being shorter than a second segment of the two segments, each of the mask openings further including a portion extending between the first segment and the second segment, the portion being longer than the first segment and the second segment, the first segment, the second segment, and the portion together forming a double-T-shaped mask opening, the first segment and the second segment being positioned at a first predetermined distance from each other in a longitudinal direction, and the portions of the mask openings being positioned at a second predetermined distance from each other;

anisotropically etching the wafer to form i) etched-out channels corresponding to the mask openings, and ii) undercut areas between the mask openings; and determining the crystal orientation as a function of a distance of one of the channels adjacent to a first one of the undercut areas to the preexisting marking, the first one of the undercut areas having an intervening space between two adjacent channels that is the largest of all intervening spaces between adjacent ones of the channels.

2. A method of determining crystal orientation in a wafer, the wafer being made of crystal with a zinc-blend crystal structure, comprising:

applying an etching mask on the wafer in a determined position relative to a preexisting marking of the wafer, the etching mask having mask openings arranged next to each other, each of the mask openings including two segments, the two segments aligned parallel to each other in a longitudinal direction, a first segment of the two segments being shorter than a second segment of the two segments, each of the mask openings further including a portion extending between the first segment and the second segment, the portion being longer than the first segment and the second segment, the first segment, the second segment, and the portion together forming a double-T-shaped mask opening, the first segment and the second segment being positioned at a first predetermined distance from each other in a longitudinal direction, and the portions of the mask openings being positioned at a second predetermined distance from each other;

anisotropically etching the wafer to form i) etched-out channels corresponding to the mask openings, and ii) undercut areas between the mask openings; and determining the crystal orientation as a function of a distance of one of the channels adjacent to a first one of the undercut areas to the preexisting marking, the first one of the undercut areas having an intervening space between two adjacent channels that is the largest of all intervening spaces between adjacent ones of the channels;

wherein the mask openings include circular scale markings.

3. The method according to claim 1, wherein the portion of the mask openings has a length, and wherein the anisotropically etching step includes the step of anisotropically etching the wafer until an etched face formed from one of the first segment and the second segment of each of the mask openings along the portion of each of the mask openings extends more than half of the length of the portion of each of the mask openings, and wherein sizes of all intervening spaces between each two adjacent ones of the etched-out channels is utilized for determining the crystal orientation.

4. The method according to claim 1, wherein the portion of each of the mask openings has a middle, the method further including the steps of:

obtaining a series of intensity values from optical measurements of light intensities reflected from the wafer along an orientation line, the orientation line extending parallel to the first segment and second segment of the mask openings and intersects the middle of the portion of the mask openings; and determining the sizes of at least some of intervening spaces between the etched-out channels in a direction of the orientation line as a function of the series of intensity values.

5. The method according to claim 1, wherein the wafer is circle-shaped and includes a flat, a radius line parallel to the flat of the wafer is the preexisting marking, the method further including the steps of:

determining a distance from the one of the channels adjacent to the first one of the undercut areas to the radius line; and determining an angle of the crystal orientation via a tangent function from the radius line and the determined distance.

6. The method according to claim 1, further comprising the steps of:

etching the wafer until at least one intervening space remains; and determining a position of the intervening space as the distance from the preexisting mark.

* * * * *